(12) United States Patent
Huang

(10) Patent No.: US 6,514,821 B1
(45) Date of Patent: Feb. 4, 2003

(54) METHOD FOR PLANARIZING DIELECTRIC LAYER OF FLASH MEMORY

(75) Inventor: Chi-Tung Huang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/165,631

(22) Filed: Jun. 7, 2002

(30) Foreign Application Priority Data

Apr. 12, 2002 (TW) ........................................ 91107423 A

(51) Int. Cl.[7] .............................................. H01L 21/336
(52) U.S. Cl. ...................... 438/257; 438/593; 438/692; 438/693
(58) Field of Search ................................ 438/257, 201, 438/266, 593, 691, 692, 693

(56) References Cited

U.S. PATENT DOCUMENTS 5,607,718 A * 3/1997 Sasaki et al. .................. 427/97
2002/0100743 A1 * 8/2002 Bonner et al. ................ 216/53

* cited by examiner

Primary Examiner—Tuan H. Nguyen
Assistant Examiner—Jack Chen
(74) Attorney, Agent, or Firm—J. C. Patents

(57) ABSTRACT

A method of planarizing a dielectric layer of a flash memory. In the present invention, a high selectivity slurry is used to planarize a dielectric layer of a flash memory. The high selectivity slurry comprises a Ceria-polishing-particle-containing slurry having $CeO_2$ and a planarity selective additive having polycarboxylate. The concentration of $CeO_2$ in the Ceria-polishing-particle-containing slurry is 5 wt % within a tolerance around 25% and the concentration of polycarboxylate in the planarity selective additive is 1–10 wt %.

20 Claims, 4 Drawing Sheets

METHOD FOR PLANARIZING DIELECTRIC LAYER OF FLASH MEMORY

CROSS-REFERENCE TO RELATED APPLICATION

This application claims the priority benefit of Taiwan application serial no. 91107423, filed Apr. 12, 2002.

BACKGROUND OF THE INVENTION

1. Field of Invention

The present invention relates to a planarizing method. More particularly, the present invention relates to a method for planarizing a dielectric layer of a flash memory.

2. Description of Related Art

Typically, chemical-mechanical polishing (CMP) process is one of the global planarizing processes in the manufacturing process of the ultra large semiconductor integrated circuit. The CMP process based on the mechanical polishing theory and is performed with the aidance of proper chemical reagent to polish the uneven profile.

In the conventional CMP process, the chemical reagent is also called slurry. The slurry is a mixture comprises colloidal-type silica, dispersed-type alumina and basic KOH or $NH_4OH$. Basically, such the polishing particles with relatively high hardness mentioned above are used to perform the polishing process on the wafer surface.

FIGS. 1A through 1E are schematic, cross-section views of a portion of a conventional method for planarizing a dielectric layer of a flash memory.

As shown in FIG. 1A, a substrate 100 having several polysilicon gate structures 102 formed thereon is provided. Moreover, every polysilicon gate structure 102 possesses a nitride layer 104 formed on the top of the polysilicon gate structure 102 as a protection.

As shown in FIG. 1B, a high density plasma oxide (HDP oxide) layer 106 is formed over the substrate 100 to fill the space between the polysilicon gate structures 102.

As shown in FIG. 1C, an alignment key oxide dipping (AOD) process is performed. It should be noticed that based on the well known photolithography theory, the AOD process is used to remove portions of the dielectric layer formed on the relatively large gate structure. A wet etching process is performed to remove a portions of the HDP oxide layer 106 to expose corners 108 of the polysilicon gate structures 102. Therefore, the HDP oxide layer 106 is separated into a filling portion 106a in the space between the polysilicon gate structure 102 and a covering portion 106b on the top of the polysilicon gate structures 102. A nitride layer 110 is formed over the substrate 100.

As shown in FIG. 1D, a CMP process is performed to planarize the nitride layer 110 and the covering portion 106b. An oxide dipping is performed to remove the metal ions formed during performing the CMP process with KOH-containing slurry in order to improve the reliability of the devices. After the oxide dipping process is performed, the thickness of the covering portion 106b is about 100 angstroms.

As shown in FIG. 1E, the remaining covering portion 106b, the nitride layers 110 and 104.

Because the AOD process is performed before the planarizing process is performed and the portion of the dielectric layer is removed by oxide dipping process to expose the corners of the polysilicon gate structures before the CMP process is performed, it takes a lot of time to finish the whole process procedure and the procedure is complex.

SUMMARY OF THE INVENTION

The invention provides a method of planarizing a dielectric layer of a flash memory. In the present invention, a high selectivity slurry (HSS) is used to planarize a dielectric layer of a flash memory. The high selectivity slurry comprises a Ceria-polishing-particle-containing slurry having $CeO_2$ and a planarity selective additive having polycarboxylate. The concentration of $CeO_2$ in the Ceria-polishing-particle-containing slurry is 5 wt % within a tolerance around 25% and the concentration of polycarboxylate in the planarity selective additive is 1–10 wt %.

In the present invention, the HSS possesses relatively high polishing speed for polishing the surface with protuberance portions and relatively low polishing speed for polishing the surface with recess portions so that the process procedure can be simplify by omitting the conventional complex steps such as oxide dipping process, AOD process and silicon nitride deposition. Therefore, the cost can be greatly decreased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 2A through 2D are schematic, cross-sectional views of the process for planarizing a dielectric layer of a flash memory in a preferred embodiment according to the invention. The present invention is not limited to apply on the planarizing process of the dielectric layer of the flash memory. It can be also apply for the planarizing process of the dielectric layer of the Mask ROM or the $E^2PROM$.

Figure 1A:
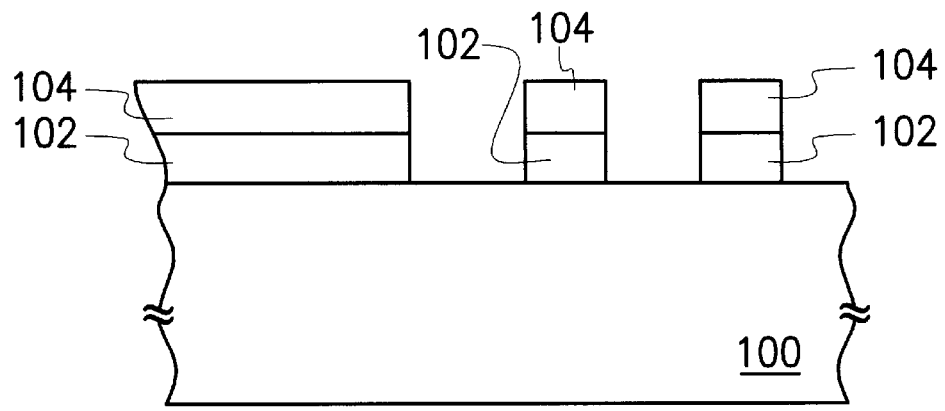
FIGS. 1A through 1E are schematic, cross-section views of a portion of a conventional method for planarizing a dielectric layer of a flash memory.
Figure 1B:
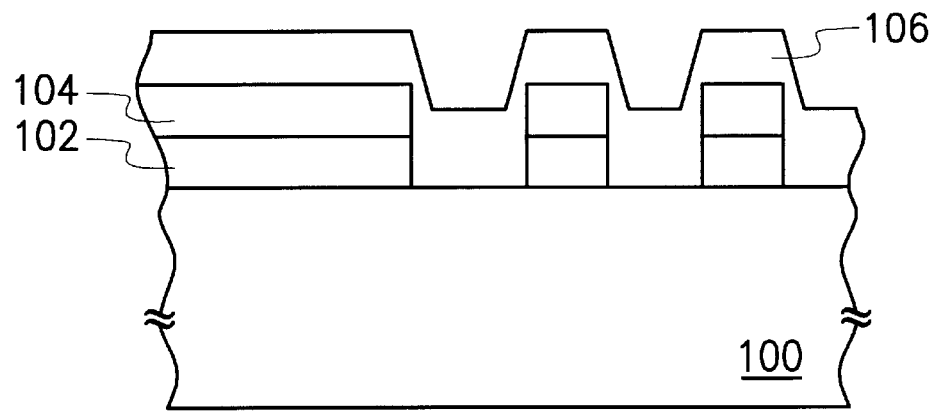
Figure 1C:
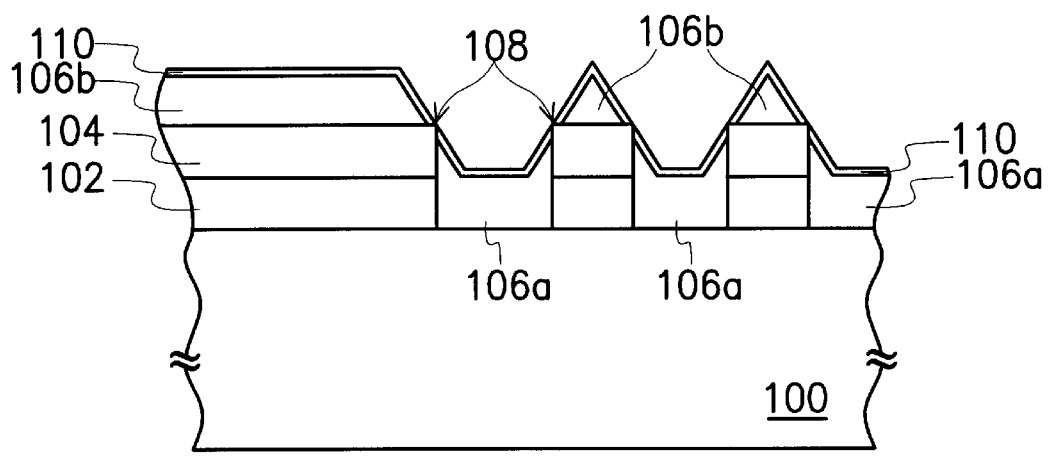
Figure 1D:
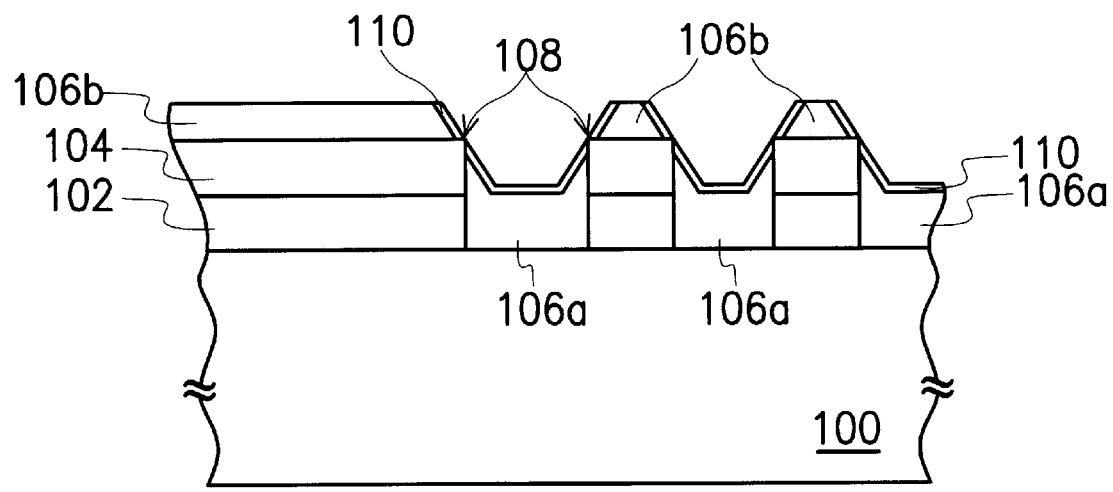
Figure 1E:
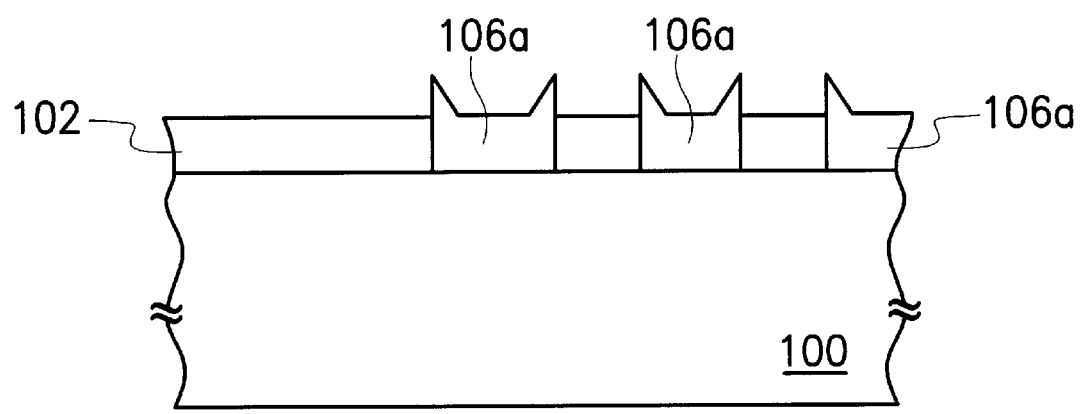
Figure 2A:
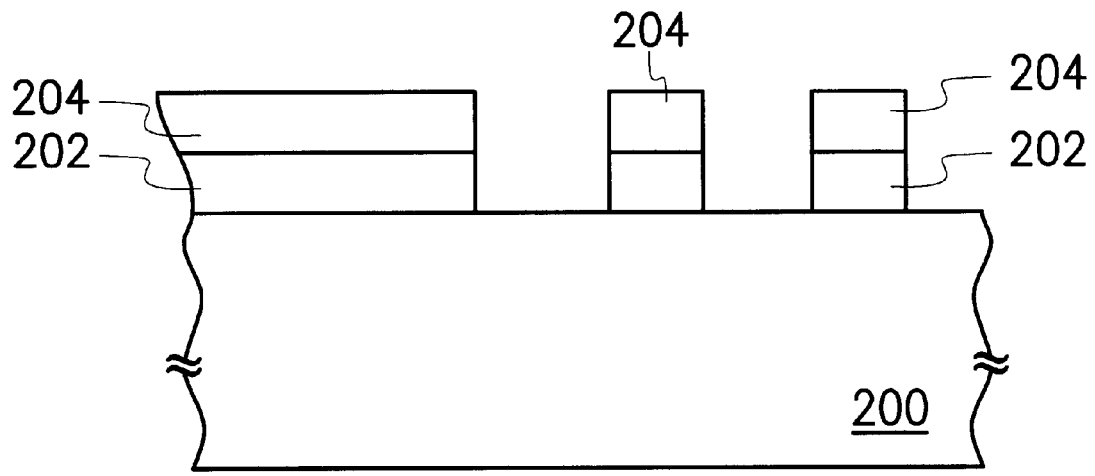
FIGS. 2A through 2D are schematic, cross-sectional views of the process for planarizing a dielectric layer of a flash memory in a preferred embodiment according to the invention.

As shown in FIG. 2A, a substrate 200 having a several gate structures 202 formed thereon is provided. Incidentally, every gate structure 202 possesses a nitride protective layer 204 formed thereon. The gate structure 202 can be formed of polysilicon, for example.

Figure 2B:
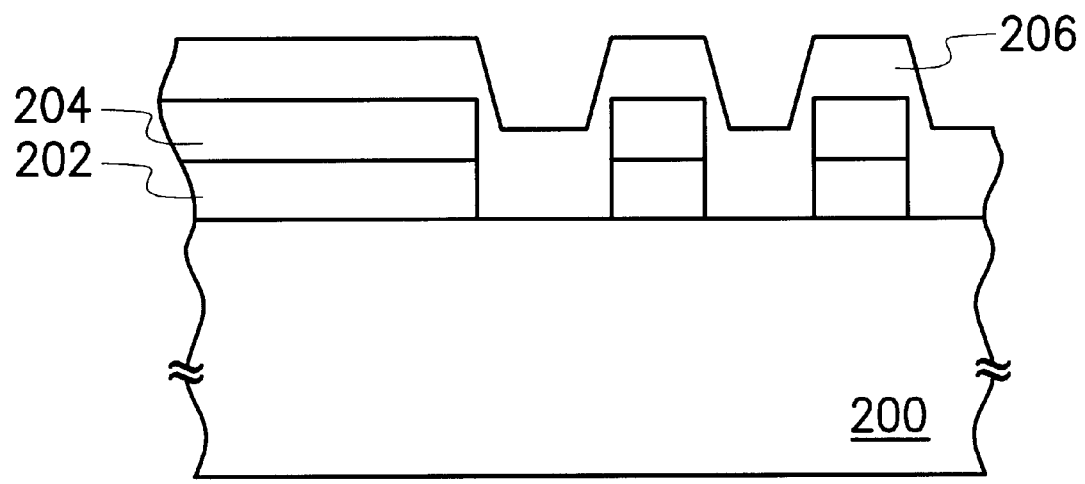

As shown in FIG. 2B, a dielectric layer 206 is formed over the substrate 200 to fill the space between the gate structures 202. The dielectric layer 206 possesses relatively good step coverage and gap filling ability. The dielectric layer 206 can be a HDP oxide layer, a plasma enhanced oxide (PE oxide) layer, a tetraethylorthosilicate (TEOS) oxide layer or a silicon-oxy-nitride layer, for example.

Figure 2C:
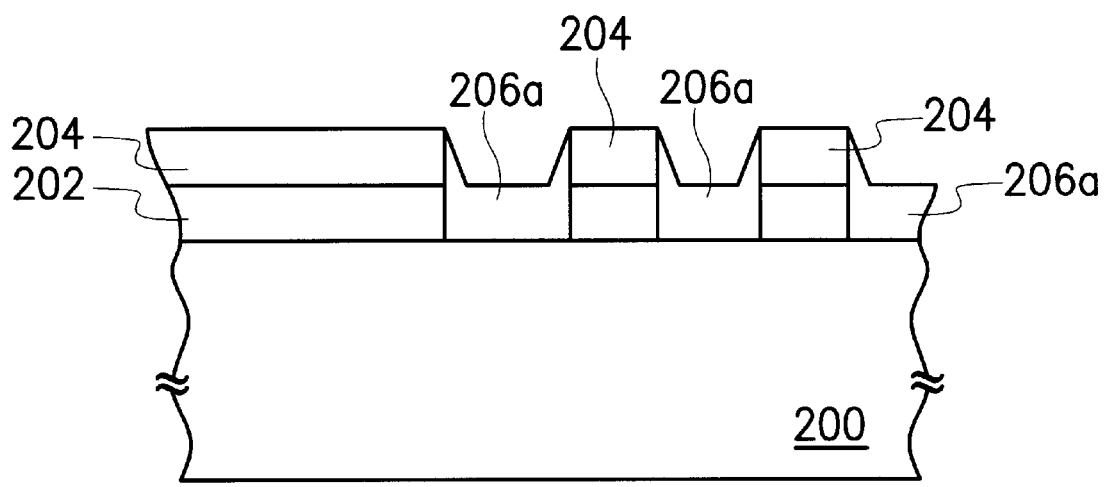

As shown in FIG. 2C, a CMP process is performed on the dielectric layer 206 by using the nitride protective layer 204 as a polishing stop layer. The slurry used in the CMP process is a high selectivity slurry (HSS) comprises a Ceria-polishing-particle-containing slurry and a planarity selectivie additive.

The Ceria-polishing-particle-containing slurry further comprises purified water and $CeO_2$ playing as polishing media. The particle concentration of $CeO_2$ is about 5 wt % within a tolerance around 25%. Preferably, the concentration of $CeO_2$ is 5 wt %. Also, under 25 celsius, the pH of the Ceria-polishing-particle-containing slurry is about 8.3 with a tolerance around 25%, the density of the Ceria-polishing-particle-containing slurry is about $1.04E3$ $Kg/m^3$ with a tolerance around 25% and the viscosity of the Ceria-polishing-particle-containing slurry is about 0.94 mPa-S with a tolerance around 25%. Preferably, the pH of the Ceria-polishing-particle-containing slurry is 8.3, the density of the Ceria-polishing-particle-containing slurry is $1.04E3$ $Kg/m^3$ and the viscosity of the Ceria-polishing-particle-containing slurry is 0.94 mPa-S.

The additive comprises purified water and polycarboxylate playing as media. The concentration of polycarboxylate is about 1–10 wt %. Further, under 25 celsius, the pH of the additive is about 6–8, the density of the additive is about $0.97–1.0E3$ $Kg/m^3$ and the viscosity of the additive is about 0.97–1.0 mPa-S.

The additive is used to improve polishing ability of $CeO_2$. Taking polycarboxylate as an example, when the slurry having polycarboxylate additive is used in the CMP process, since $\zeta$ potential of polycarboxylate and silicon oxide (dielectric layer) is about −50 mV and $\zeta$ potential of polycarboxylate and silicon nitride (protective layer) is about 0 mV, numbers of polycarboxylate adsorbing on the silicon oxide layer is fewer than that adsorbing on the silicon nitride layer. Hence, it is easier to use $CeO_2$ polishing particles to polish the silicon oxide layer than to polish the silicon nitride. Therefore, the adsorbing potential of the additive to the protective layer is larger than that of the additive to the dielectric layer.

Since HSS possesses relatively high polishing speed for polishing the surface with protuberance portions and relatively low polishing speed for polishing the surface with recess portions, the polishing result of the CMP process performing on the dielectric layer 206 is shown as polished dielectric layer 206a in FIG. 2C. Utilizing the CMP process with the use of a HSS can simplify the process procedure by omitting the conventional complex steps such as oxide dipping process, AOD process and silicon nitride deposition so that the cost can be greatly decreased.

Furthermore, after the CMP process is performed, a wet etching process is performed to remove a portion of the dielectric layer 206a in order to remove the metal ions formed during the CMP process is formed with a KOH-containing slurry to improve the reliability of the devices. Therefore, the thickness of the remaining dielectric layer is about 100 angstroms.

Figure 2D:
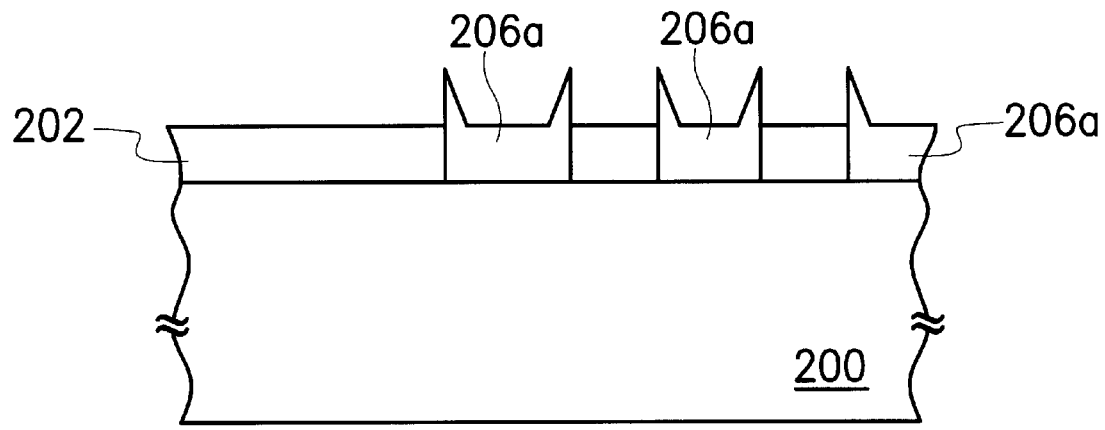

As shown in FIG. 2D, the nitride protective layer 204 is removed to expose the top surface of the gate structure 202.

In the present invention, the HSS possesses relatively high polishing speed for polishing the surface with protuberance portions and relatively low polishing speed for polishing the surface with recess portions so that the process procedure can be simplify by omitting the conventional complex steps such as oxide dipping process, AOD process and silicon nitride deposition. Therefore, the cost can be greatly decreased and the procedure can be well controlled.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of planarizing a dielectric layer of a flash memory, comprising the steps of:

providing a substrate having a plurality of gate structures formed thereon, wherein every gate structure possesses a protective layer formed thereon;

forming a dielectric layer over the substrate; and performing a CMP process on the dielectric layer by using the protective layer as a polishing stop layer, wherein a slurry used in the CMP process is a high selectivity slurry comprising a Ceria-polishing-particle-containing slurry having $CeO_2$ and a planarity selective additive having polycarboxylate, and the concentration of $CeO_2$ in the Ceria-polishing-particle-containing slurry is 5 wt % within a tolerance around 25% and the concentration of polycarboxylate in the planarity selective additive is 1–10 wt %.

2. The method of claim 1, wherein under 25 celsius, the pH of the Ceria-polishing-particle-containing slurry is about 8.3 with a tolerance around 25%.

3. The method of claim 1, wherein under 25 celsius, the density of the Ceria-polishing-particle-containing slurry is about $1.04 \times 10^3$ $Kg/m^3$ with a tolerance around 25%.

4. The method of claim 1, wherein under 25 celsius, the viscosity of the Ceria-polishing-particle-containing slurry is 0.94 mPa-S with a tolerance around 25%.

5. The method of claim 1, wherein Ceria-polishing-particle-containing slurry comprises purified water as media.

6. The method of claim 1, wherein under 25 celsius, the pH of the planarity selective additive is about 6–8.

7. The method of claim 1, wherein under 25 Celsius, the density of the planarity selective additive is about $0.97–1.0E3$ $Kg/m^3$.

8. The method of claim 1, wherein under 25 Celsius, the viscosity of the planarity selective additive is about 0.97–1.0 mPa-S.

9. The method of claim 1, wherein the planarity selective additive further comprises purified water playing as media.

10. The method of claim 1, wherein the method further comprises a step of a wet etching process is performed to remove a portion of the dielectric layer after the step of performing the CMP process.

11. A method for planarizing a dielectric layer, comprising the steps of:

providing a substrate having a plurality of gate structures formed thereon, wherein every gate structure possesses a protective layer formed thereon;

forming a dielectric layer over the substrate; and performing a CMP process on the dielectric layer by using the protective layer as a polishing stop layer, wherein a slurry used in the CMP process is a high selectivity slurry comprising a Ceria-polishing-particle-containing slurry having $CeO_2$ and a planarity selective additive having polycarboxylate, and the concentration of $CeO_2$ in the Ceria-polishing-particle-containing slurry is 5 wt % within a tolerance around 25% and an adsorbing potential of the planarity selective additive to the protective layer is larger than that of the planarity selective additive to the dielectric layer.

12. The method of claim 11, wherein under 25 celsius, the pH of the Ceria-polishing-particle-containing slurry is about 8.3 with a tolerance around 25%.

13. The method of claim 11, wherein under 25 celsius, the density of the Ceria-polishing-particle-containing slurry is about 1.04E3 Kg/m$^3$ with a tolerance around 25%.

14. The method of claim 11, wherein under 25 celsius, the viscosity of the Ceria-polishing-particle-containing slurry is 0.94 mPa-S with a tolerance around 25%.

15. The method of claim 11, wherein Ceria-polishing-particle-containing slurry comprises purified water as media.

16. The method of claim 11, wherein wherein the method further comprises a step of a wet etching process is performed to remove a portion of the dielectric layer after the step of performing the CMP process.

17. The method of claim 11, wherein the planarity selective additive comprises polycarboxylate with a concentration about 1–10 wt %.

18. The method of claim 11, wherein under 25 celsius, the pH of the planarity selective additive is about 6–8.

19. The method of claim 11, wherein under 25 Celsius, the density of the planarity selective additive is about 0.97–1.0E3 Kg/m$^3$.

20. The method of claim 11, wherein under 25 Celsius, the viscosity of the planarity selective additive is about 0.97–1.0 mPa-S.

* * * * *